US009711501B1

(12) United States Patent
Basker et al.

(10) Patent No.: US 9,711,501 B1
(45) Date of Patent: Jul. 18, 2017

(54) INTERLAYER VIA (71) Applicant: International Business Machines Corporation, Armonk, NY (US)

(72) Inventors: Veeraraghavan S. Basker, Schenectady, NY (US); Lawrence A. Clevenger, LaGrangeville, NY (US); Terence B. Hook, Jericho, VT (US); Joshua M. Rubin, Albany, NY (US); Tenko Yamashita, Schenectady, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/276,333

(22) Filed: Sep. 26, 2016

(51) Int. Cl.
H01L 27/00 (2006.01)
H01L 27/06 (2006.01)
H01L 23/528 (2006.01)
H01L 23/522 (2006.01)
H01L 29/06 (2006.01)
H01L 21/8238 (2006.01)
H01L 21/768 (2006.01)
H01L 21/311 (2006.01)
(Continued)

(52) U.S. Cl.
CPC .... *H01L 27/0688* (2013.01); *H01L 21/31116* (2013.01); *H01L 21/76802* (2013.01); *H01L 21/76877* (2013.01); *H01L 21/823871* (2013.01); *H01L 23/528* (2013.01); *H01L 23/5226* (2013.01); *H01L 27/0611* (2013.01); *H01L 27/092* (2013.01); *H01L 27/105* (2013.01); *H01L 29/0665* (2013.01)

(58) Field of Classification Search
CPC . H01L 27/0688; H01L 27/0611; H01L 27/105
See application file for complete search history.

(56) References Cited

U.S. PATENT DOCUMENTS 5,675,185 A 10/1997 Chen et al.
6,627,953 B1 * 9/2003 Vu .................... A61B 3/113
257/347

(Continued)

FOREIGN PATENT DOCUMENTS

WO 2014209278 A1 12/2014

*Primary Examiner* — Ngan Ngo
(74) *Attorney, Agent, or Firm* — Cantor Colburn LLP; Vazken Alexanian (57) ABSTRACT

A semiconductor device is provided. The semiconductor device includes a lower layer, an upper layer and an interlayer via. The lower layer includes a lower substrate, lower electronic devices, metallization elements and contact elements. One of the lower electronic devices includes a field effect transistor (FET), lower contacts and spacers interposed between the FET and the lower contacts. At least one of the contact elements is electrically coupled between a metallization element and one of the lower contacts to form a stack. The upper layer includes an upper substrate and upper electronic devices. One of the upper electronic devices includes an FET, upper contacts and spacers interposed between the FET and the upper contacts. The upper substrate and one of the upper contacts define a through-hole aligned with the stack. The interlayer via extends through the through-hole to electrically couple the stack and the one of the upper contacts.

10 Claims, 11 Drawing Sheets (51) Int. Cl.
*H01L 27/092* (2006.01)
*H01L 27/105* (2006.01)

(56) References Cited

U.S. PATENT DOCUMENTS

| | | |
|---|---|---|
| 6,846,741 B2 | 1/2005 | Cooney, III et al. |
| 7,393,777 B2 | 7/2008 | Cooney, III et al. |
| 7,407,875 B2 | 8/2008 | Wong et al. |
| 8,658,474 B2 | 2/2014 | Summerfelt |
| 8,659,165 B2 | 2/2014 | Summerfelt |
| 8,921,982 B2 | 12/2014 | Tomita |
| 9,048,297 B2 | 6/2015 | Summerfelt |
| 2004/0140502 A1* | 7/2004 | Murata ................. G11C 11/412 257/328 |
| 2005/0275034 A1 | 12/2005 | Deshpande et al. |
| 2007/0020829 A1* | 1/2007 | Hotta ................ H01L 21/76808 438/172 |
| 2013/0037965 A1* | 2/2013 | Morimoto ........... H01L 23/5286 257/774 |
| 2015/0035065 A1* | 2/2015 | Park ...................... H01L 27/105 257/368 |
| 2015/0221718 A1* | 8/2015 | Rhie ....................... H01L 28/90 257/534 |
| 2016/0020305 A1* | 1/2016 | Obradovic .......... H01L 29/7391 257/39 |
| 2016/0197069 A1 | 7/2016 | Morrow et al. |

* cited by examiner

INTERLAYER VIA

BACKGROUND

The present invention relates to semiconductor devices and, more specifically, to fabrication method and resulting structures for an interlayer via with a double spacer and sidewall contacts.

In semiconductor device manufacturing, three dimensional (3D) monolithic designs often use stacked layers of devices that are sequentially processed to reduce a device footprint. In such cases and especially for devices with p-type field effect transistors (FETs) over n-type FETs or vice versa, there needs to be a significant number of interlayer vias provided to make a functional circuit. Such interlayer vias can consume a large amount of surface area and thereby diminish scaling benefits of this approach.

SUMMARY

According to a non-limiting embodiment of the present invention, a semiconductor device is provided. The semiconductor device includes a lower layer, an upper layer and an interlayer via. The lower layer includes a lower substrate, lower electronic devices, metallization elements and contact elements. One of the lower electronic devices includes a field effect transistor (FET), lower contacts and spacers interposed between the FET and the lower contacts. At least one of the contact elements is electrically coupled between a metallization element and one of the lower contacts to form a stack. The upper layer includes an upper substrate and upper electronic devices. One of the upper electronic devices includes an FET, upper contacts and spacers interposed between the FET and the upper contacts. The upper substrate and one of the upper contacts define a through-hole aligned with the stack. The interlayer via extends through the through-hole to electrically couple the stack and the one of the upper contacts.

According to another non-limiting embodiment, a semiconductor device is provided. The semiconductor device includes a lower layer, an upper layer and an interlayer via. The lower layer includes a lower substrate, lower electronic devices, metallization elements and contact elements. One of the lower electronic devices includes a field effect transistor (FET), lower contacts and spacers interposed between the FET and the lower contacts. At least one of the contact elements is electrically coupled between a metallization element and one of the lower contacts to form a stack. The upper layer includes an upper substrate and upper electronic devices. One of the upper electronic devices includes a nanosheet FET, epitaxial contacts and spacers interposed between the nanosheet FET and the epitaxial contacts. The upper substrate defines a through-hole aligned with the stack. The interlayer via extends through the through-hole to electrically couple the stack and the epitaxial contacts.

According to yet another non-limiting embodiment, a method of contact material protection during an interlayer via etch is provided. The method includes depositing a first material over a semiconductor device of an upper layer, defining a contact opening through the first material to a contact of the semiconductor device and depositing a second material over a periphery of the contact and along interior sidewalls of the contact opening. The method further includes defining an additional contact opening through a central portion of the contact, which is exposed by the second material, and through a substrate of the upper layer, removing the second material and forming an interlayer via. The forming of the interlayer via is conducted in the contact opening and the additional contact opening such that the interlayer via electrically couples the contact with a contact of a semiconductor device of a lower layer.

Additional features are realized through the techniques of the present invention. Other embodiments are described in detail herein and are considered a part of the claimed invention. For a better understanding of the invention with the features, refer to the description and to the drawings.

BRIEF DESCRIPTION OF THE DRAWINGS

The subject matter which is regarded as the invention is particularly pointed out and distinctly claimed in the claims at the conclusion of the specification. The foregoing and other features of the invention are apparent from the following detailed description taken in conjunction with non-limiting embodiments illustrated in the accompanying drawings. In particular, FIGS. 1-13 and 14-21 are series of views illustrating according to exemplary embodiments of the present teachings, in which:

DETAILED DESCRIPTION

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present invention to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The term "exemplary" is used herein to mean "serving as an example, instance, or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include both an indirect "connection" and a direct "connection."

For the sake of brevity, conventional techniques related to semiconductor device and IC fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the present description utilizes a variety of individually known physical and chemical processes performed on a semiconductor (e.g., silicon) substrate. In general, the various processes used to form a micro-chip that will be packaged into an IC fall into three categories, namely, film deposition, patterning, etching and semiconductor doping. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Fundamental to all of the above-described fabrication processes is semiconductor lithography, i.e., the formation of three-dimensional relief images or patterns on the semiconductor substrate for subsequent transfer of the pattern to the substrate. In semiconductor lithography, the patterns are a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to an overview of the present invention, one or more embodiments relate to the provision of interlayer vias that are incorporated in source or drain contacts of p-type or n-type field effect transistors (FETs) if sufficient space is available and if contact to the devices in question can still be achieved. To this end, a double spacer process is employed to protect source or drain material during an interlayer via etch and to enable device contact.

The approach can be applied to a planar FET, a FINFET or a nanosheet FET. The device(s) being acted upon can have source or drain epitaxial growth or just be fin or sheet with sufficient doping. In addition, there are different methods available for forming the source or drain region. One method would involve typical formation methods for planar or FINFET structures whereas an alternative method would involve a complete recess of a source or drain region and then a regrowth of material there, formation of a second spacer and then an execution of an interlayer via reactive ion etch (ME). In each case, some source or drain material is protected with a second spacer the interlayer via RIE is performed. The methods could be executed with respect to multiple layer structures depending on aspect ratio allowances.

Figure 1:
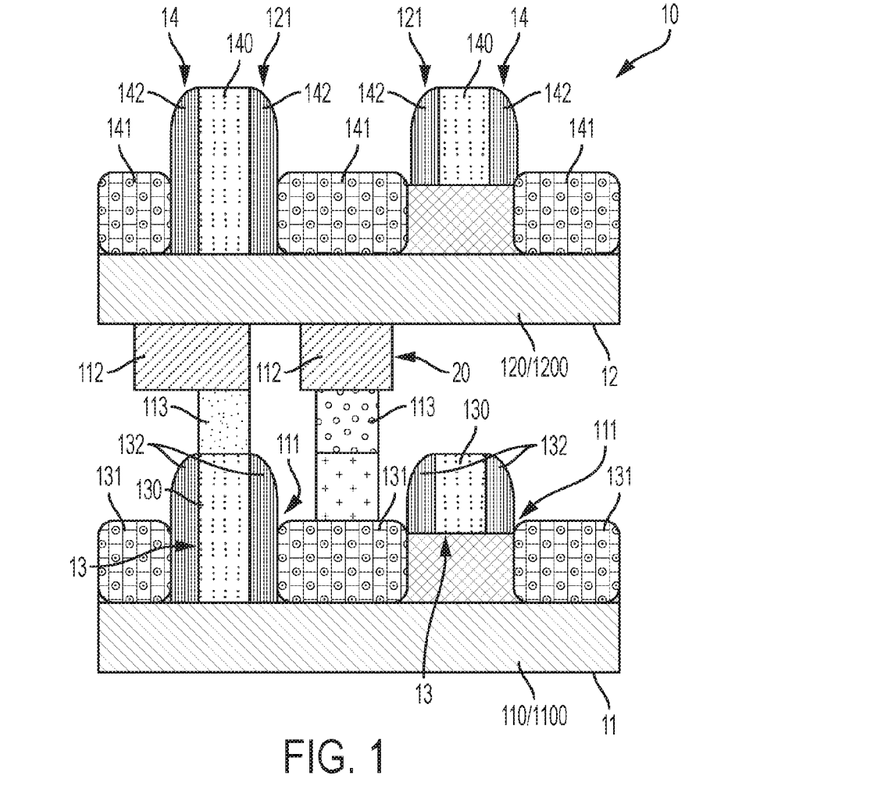
FIG. 1 is a side view of a three-dimensional (3D) monolithic semiconductor device in accordance with one or more embodiments.

Turning now to a more detailed description of embodiments of the present invention, FIG. 1 illustrates a 3D monolithic semiconductor device 10. As shown in FIG. 1, semiconductor device 10 includes a lower layer 11 and an upper layer 12. An interlayer via will be formed and added to the semiconductor device as described below.

The semiconductor substrate 10 can be, for example, a bulk substrate that includes semiconductor material that in turn includes, but is not limited to, silicon (Si), silicon germanium (SiGe), silicon carbide (SiC), silicon-germanium-carbon (SiGeC) or other like semiconductor material. Although silicon is the predominantly used semiconductor material in wafer fabrication, alternative semiconductor materials can be employed. Such alternative semiconductor materials can include, but are not limited to, germanium, gallium arsenide, gallium nitride, silicon germanium, cadmium telluride and zinc selenide. In addition, multiple layers of the semiconductor materials can be used as the semiconductor material of the semiconductor substrate 10.

The semiconductor substrate 10 can also have multiple material layers, for example, a semiconductor-on-insulator substrate (SeOI), a silicon-on-insulator substrate (SOI), a germanium-on-insulator substrate (GeOI) or a silicon-germanium-on-insulator substrate (SGOI). The semiconductor substrate 10 can also have other layers forming the substrate 10, including high-k oxides and/or nitrides, as well as other structures, such as trench isolation features. In one or more embodiments, the semiconductor substrate 10 can be a silicon wafer or, more particularly, a single crystal or a monocrystalline silicon wafer.

The lower layer 11 includes a lower layer substrate 110, which can be provided as a semiconductor substrate 1100, lower layer electronic devices 111, metallization layer elements 112 and contact elements 113. Of the lower layer electronic devices 111, at least one can be provided as a lower layer FET 13 including a lower layer gate 130, lower layer drain or source contacts 131 (the lower layer drain or source contacts 131 are interchangeable and will be assumed to be epitaxial contacts for the purposes of this description) and lower layer spacers 132. In the embodiments of FIG. 1, two electronics devices are illustrated on the lower layer 11 with one being a planar FET, the other being a FINFET and one of the lower layer source or drain contacts 131 being interposed between them.

It is to be understood that both devices in FIG. 1 (and other figures in the application) are or can be the same type (i.e., they can all be either planar or fin FETs) or different types. In this case, they are the same and only look different because the cross-section shown in the illustration is taken at an angle that is not quite parallel to the fins.

The lower layer spacers 132 are interposed between the lower layer FET 13 and the lower layer drain or source contacts 131. The lower layer FET 13 can be provided as a planar FET, as a FINFET or as a nanosheet FET. The metallization layer elements 112 are formed of metals or metallic alloys and are provided as conductive elements between the lower layer 11 and the upper layer 12. The contact elements 113 are similarly formed of conductive materials and serve to electrically couple the metallization layer elements 112 to the lower layer FET 13.

In particular, at least one of the contact elements 113 is electrically coupled between a metallization layer element 112 and one of the lower layer drain or source contacts 131. This one of the contact elements 113, the metallization layer element 112 and the one of the lower layer drain or source contacts 131 form a stack 20. It is to be understood, however, that the metallization layer element 112 and the contact element 113 or any other intermediate layer feature is not required and can be discarded or removed (e.g., an interlayer via to be described below could be directly connected to the one of the lower layer drain or source contact 131).

The upper layer 12 includes an upper layer substrate 120, which can be provided as one or more bonding films 1200, and upper layer electronic devices 121. Of the upper layer electronic devices 121, at least one can be provided as an upper layer FET 14 including an upper layer gate 140, upper layer drain or source contacts 141 (the upper layer drain or source contacts 141 are interchangeable and will be assumed to be epitaxial contacts for the purposes of this description) and upper layer spacers 142. In the embodiments of FIG. 1, two electronics devices are illustrated on the upper layer 12 with one being a planar FET, the other being a FINFET (once again, the devices can be the same or different types of devices as compared to one another) and one of the upper layer source or drain contacts 141 being interposed between them. The upper layer FET 14 can be provided as a planar FET, as a FINFET or as a nanosheet FET.

Figure 2:
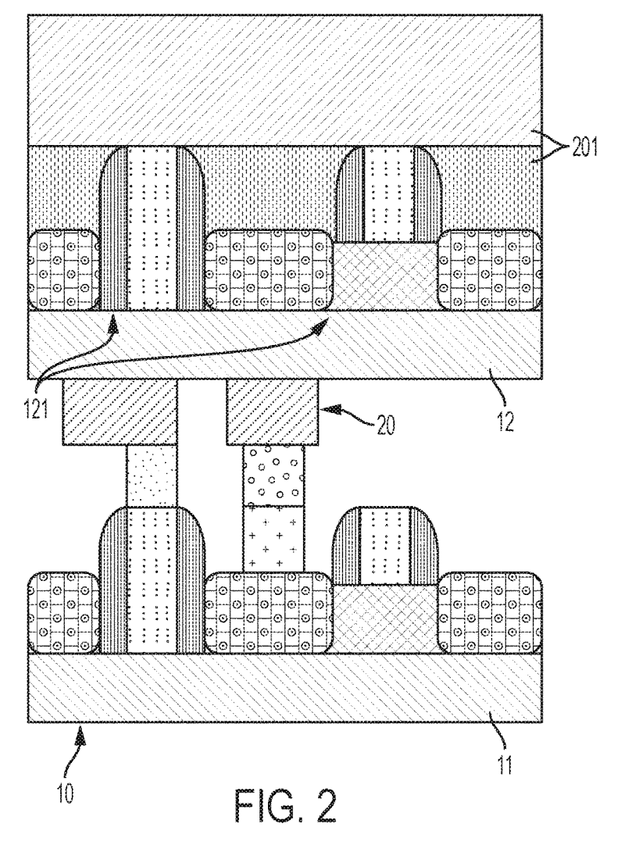
FIG. 2 is a side view of oxides deposited over an upper layer of a three-dimensional (3D) monolithic semiconductor device in accordance with one or more embodiments.

With reference to FIG. 2, first oxides 201 are deposited over the upper layer 12 and the upper layer electronic devices 121. The first oxides 201 can include similar or different oxides with the upper oxide provided, if necessary, to account for a height of one or more of the upper layer electronic devices 121. It is to be understood that, of the first oxides 201, the upper one could be optional and generally serves to provide for additional height so that the second spacer (to be described below) will not pull down and reveal protected epitaxial growth (also to be described below).

Figure 3:
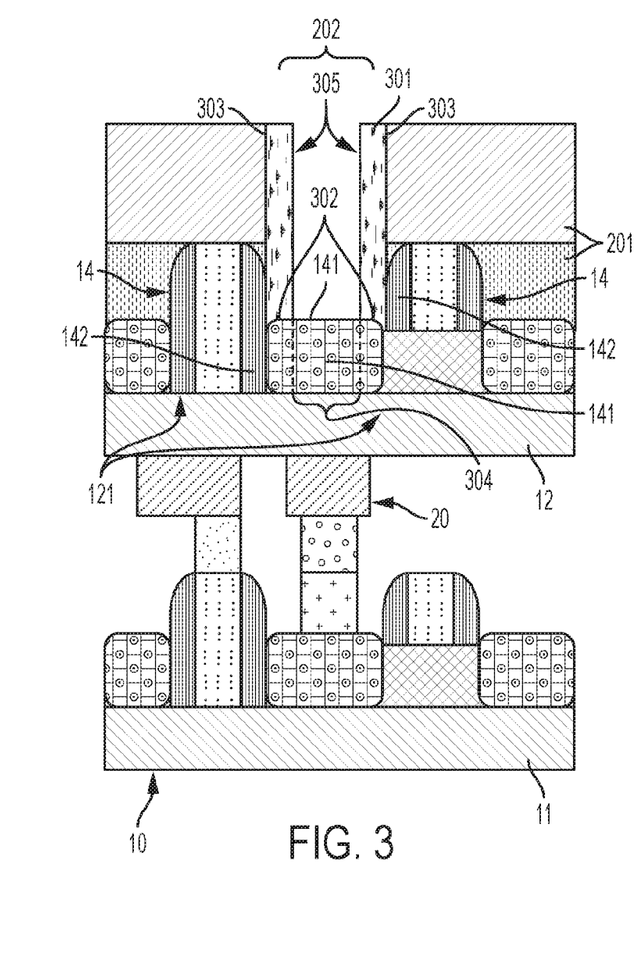
FIG. 3 is a side view of a second spacer deposited in a contact hole formed through oxides deposited over an upper layer of a three-dimensional (3D) monolithic semiconductor device in accordance with one or more embodiments.

In any case, with reference to FIG. 3, once the first oxides 201 are deposited, a contact hole 202 is defined through the first oxides 201 to one of the upper layer source or drain contacts 141. For purposes of clarity and brevity, the one of the upper layer source or drain contacts 141 will be assumed to be an upper layer drain contact 141 that is interposed between two upper layer FETs 14. Thus the contact hole 202 extends downwardly through the first oxides 201 to an upper surface of the upper layer drain contact 141 between opposite facing upper layer spacers 142 of the two upper layer FETs 14.

A second oxide 301 is then deposited over a periphery 302 of the upper surface of the upper layer drain contact 141. The second oxide 301 can thus extend from the upper layer drain contact 141 along interior facing sidewalls 303 of the contact hole 202 to terminate at or close to an uppermost surface of the first oxides 201. The second oxide 301 can be provided as a tubular feature that covers the periphery 302 and the interior facing sidewalls 303 but leaves a central portion 304 of the upper layer drain contact 141 exposed. Because the interior facing sidewalls 303 at lower heights are formed as the upper layer spacers 142 for the two upper layer FETs 14, the second oxide 301 therefore serves effectively as a second spacer 305 for the two upper layer FETs 14.

The terms first oxides and second oxide, as used herein, may actually refer to various types of materials, such as oxides, insulators and even metallic materials. That is, the use of the "oxide" terminology is done for clarity and brevity and should not be considered as limiting the scope of the specification or the following claims in any way.

Figure 4:
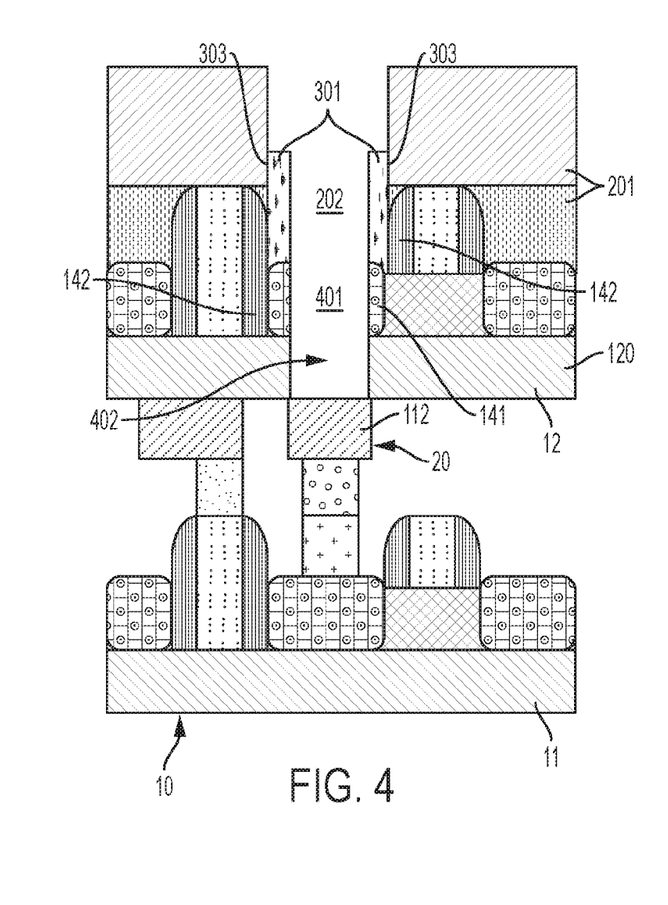
FIG. 4 is a side view of a through-hole formed through oxides deposited over an upper layer of a three-dimensional (3D) monolithic semiconductor device and through the upper layer in accordance with one or more embodiments.

With reference to FIG. 4, the second oxide 301 is somewhat recessed from the uppermost surface of the first oxides 201 but remains tall enough to cover the interior facing sidewalls 303 along the upper layer spacers 142. At this point, RIE is conducted to form an additional contact hole 401 through the central portion 304 (see FIG. 3) of the upper layer drain contact 141, which is exposed by the second oxide 301, and the upper layer substrate 120. The ME can include silicon germanium (SiGe) ME at the upper layer drain contact 141 and a bonding film ME at the upper layer substrate 120. The additional contact hole 401 extends from a lowermost extent of the contact hole 202 to an upper surface of the metallization layer element 112 of the stack 20 to define a through-hole 402.

Figure 5:
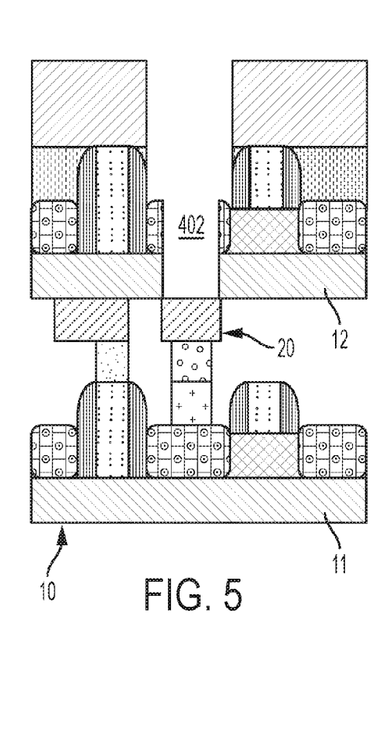
FIG. 5 is a side view of the through-hole of FIG. 4 with a second spacer having been removed in accordance with one or more embodiments.

With reference to FIG. 5, once the through-hole 402 is defined as a combination of the contact hole 202 and the additional contact hole 401, the second oxide 301 (i.e., the second spacer 305) can be removed.

With continued reference to FIG. 5, upper layer 12 could be undercut during the removal of the second spacer 305. Bonding films of silicon nitride or other suitable materials could be used in the upper layer 12 to prevent such occurrences.

Figure 6:
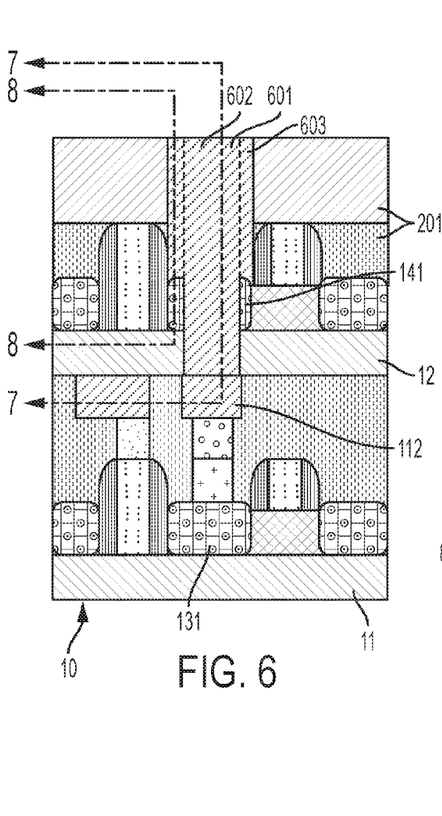
FIG. 6 is a side view of an interlayer via disposed within the through-hole of FIG. 4 in accordance with one or more embodiments.

With reference to FIG. 6, an interlayer via 601 is formed of electrically conductive material. The interlayer via 601 can be formed by tungsten being filled into the contact hole 202 and the additional contact hole 401 (see FIG. 4) along with other liner materials and possibly some combination of titanium and/or titanium nitride and then being formed into a silicide. The interlayer via 601 thus electrically contacts the upper surface of the metallization layer element 112 of the stack 120 and the upper layer drain contact 141. Therefore, the interlayer via 601 extends through the through-hole 402 to electrically couple the upper layer drain contact 141 to the one of the lower layer drain or source contacts 131, which will now be assumed to be the lower layer source (of course, the one of the lower layer drain or source contacts 131 could also be a drain contact in which case the device would be formed as a simple inverter circuit) contact 131 as a complement to the upper layer drain contact 141, via the stack 20. The interlayer via 601 includes a central portion 602, which extends through what was the central portion 304 of the upper layer drain contact 141, and a peripheral flange 603 that occupies the space that was formerly occupied by the second oxide 301 (see FIG. 4).

Figure 7:
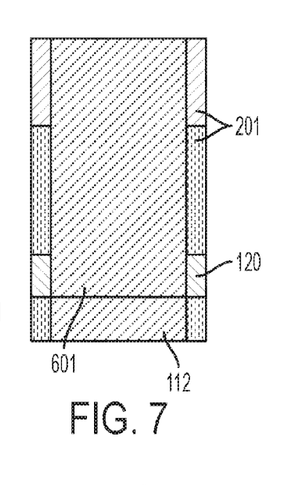
FIG. 7 is a cross-sectional view of the interlayer via taken along line 7-7 of FIG. 6 in accordance with one or more embodiments.

With reference to FIG. 7, the interlayer via 601 extends upwardly from the metallization layer element 112 of the stack 20 and occupies all or nearly all of the space provided within the through-hole 402.

Figure 8:
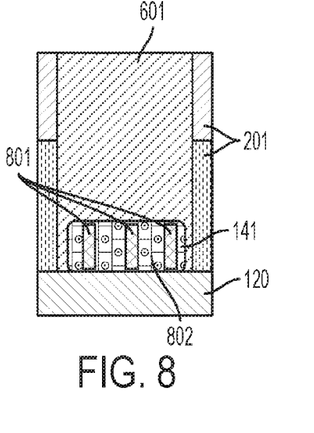
FIG. 8 is a cross-sectional view of the interlayer via taken along line 8-8 of FIG. 6 in accordance with one or more alternative embodiments.

In accordance with one or more alternative embodiments and, with reference to FIG. 8, the upper layer drain contact 141 can include a plurality of fins 801 that are surrounded by merged epitaxial growth 802. The fins 801 can extend upwardly from the upper layer substrate 120 and can be formed of semiconductor material. The merged epitaxial growth 802 can be formed by epitaxial growth off of the fins 801 and is thus disposed in electrical contact with the fins 801 and the interlayer via 601.

Figure 9:
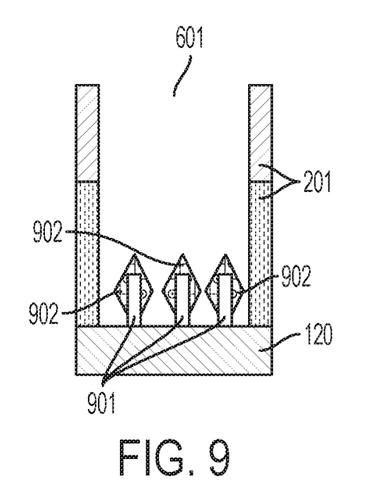
FIG. 9 is a cross-sectional view of the interlayer via taken along line 8-8 of FIG. 6 in accordance with one or more alternative embodiments.

In accordance with one or more alternative embodiments and, with reference to FIG. 9, the upper layer drain contact 141 can include a plurality of fins 901 that are each surrounded by un-merged epitaxial growths 902. The fins 901 can extend upwardly from the upper layer substrate 120 and can be formed of semiconductor material. The un-merged epitaxial growths 902 can be formed by epitaxial growth off of the fins 901 and are thus disposed in electrical contact with the fins 901 and the interlayer via 601.

Figure 10:
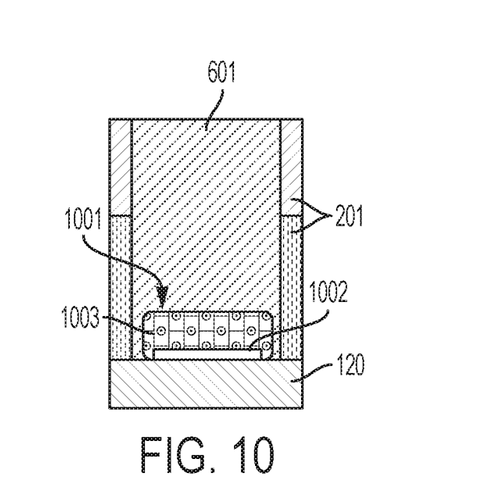
FIG. 10 is a cross-sectional view of the interlayer via taken along line 8-8 of FIG. 6 in accordance with one or more alternative embodiments.

In accordance with one or more alternative embodiments and, with reference to FIG. 10, the upper layer drain contact 141 can be provided as a planar device 1001. The planar device 1001 includes a planar element 1002, which extends along an upper surface of the upper layer substrate 120 and can be formed of semiconductor material, and epitaxial growth 1003. The epitaxial growth 103 can be formed by epitaxial growth off of the planar element 1002 and is thus disposed in electrical contact with the planar element 1002 and the interlayer via 601.

Figure 11:
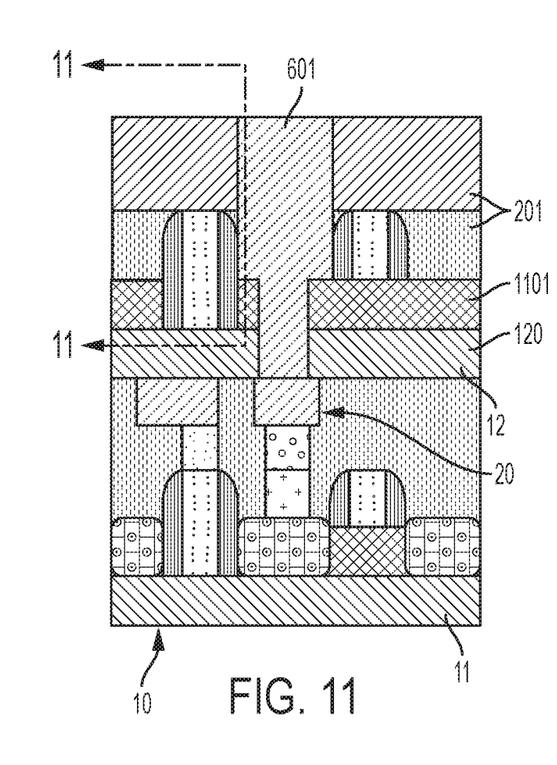
FIG. 11 is a side view of an interlayer via disposed within a through-hole formed through an upper layer of a 3D monolithic semiconductor device in accordance with one or more alternative embodiments.

In accordance with one or more further alternative embodiments, it is to be understood that the upper layer drain contact 141 can be replaced with a fin structure in which a layer of sufficiently doped semiconductor material 1101 is employed as an effective drain contact. This is illustrated in FIG. 11, which includes structures that are otherwise similar to those of FIG. 6 and thus need not be described in detail.

Figure 12:
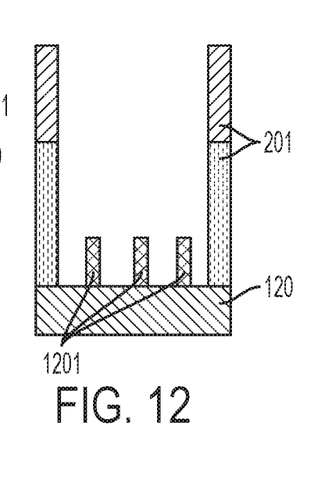
FIG. 12 is a cross-sectional view of the interlayer via taken along line 11-11 of FIG. 11 in accordance with one or more alternative embodiments.

In accordance with one or more alternative embodiments and, with reference to FIG. 12, the sufficiently doped semiconductor material 1101 can be provided as a plurality of fins 1201. The fins 1201 can extend upwardly from the upper layer substrate 120 and can be formed of sufficiently doped semiconductor material to establish a conductive coupling with the interlayer via 601.

Figure 13:
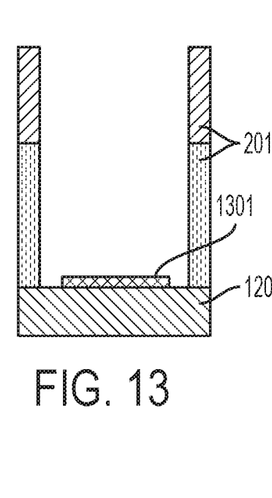
FIG. 13 is a cross-sectional view of the interlayer via taken along line 11-11 of FIG. 11 in accordance with one or more alternative embodiments.

In accordance with one or more alternative embodiments and, with reference to FIG. 13, the sufficiently doped semiconductor material 1101 can be provided as a planar element 1301. The planar element 1301 can extent along an upper surface of the upper layer substrate 120 and can be formed of sufficiently doped semiconductor material to establish a conductive coupling with the interlayer via 601.

Figure 14:
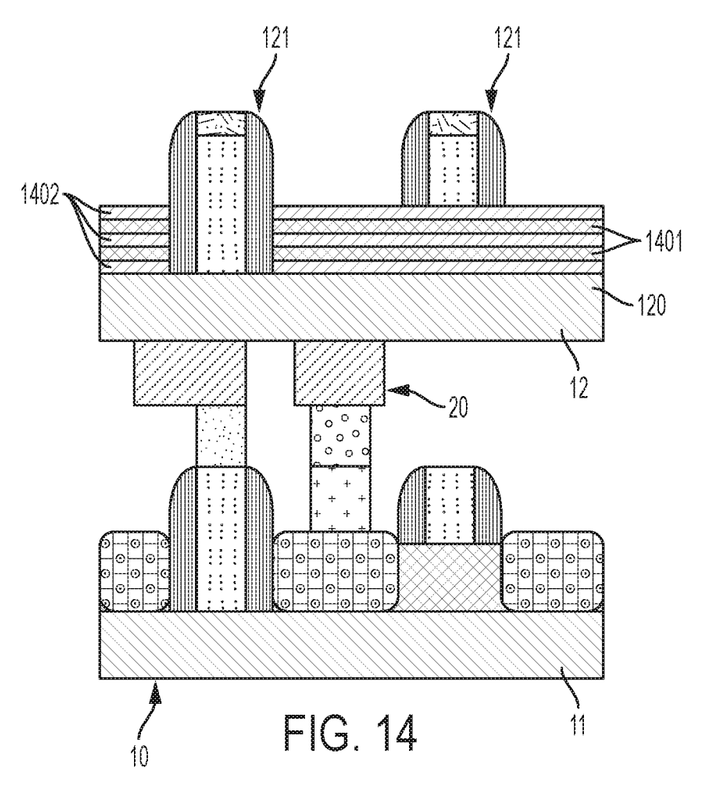
FIG. 14 is a side view of a three-dimensional (3D) monolithic semiconductor device with nanosheet field effect transistors (FETs) in accordance with one or more embodiments.

In accordance with one or more embodiments and, with reference to FIG. 14, the semiconductor device 10 is illustrated with two nanosheet FETs (i.e., one planar nanosheet FET and one nanosheet FINFET although, as above, both devices could be same or different types as compared to one another) as the upper layer electronic devices 121 and additional structures that are otherwise similar to those of FIGS. 1-13 and thus need not be described further. As shown in FIG. 14, the nanosheet FETs are formed from or otherwise include a plurality of silicon (Si) and silicon germanium (SiGe) layers 1401 and 1402 that are interleaved with one another in a vertical direction.

Figure 15:
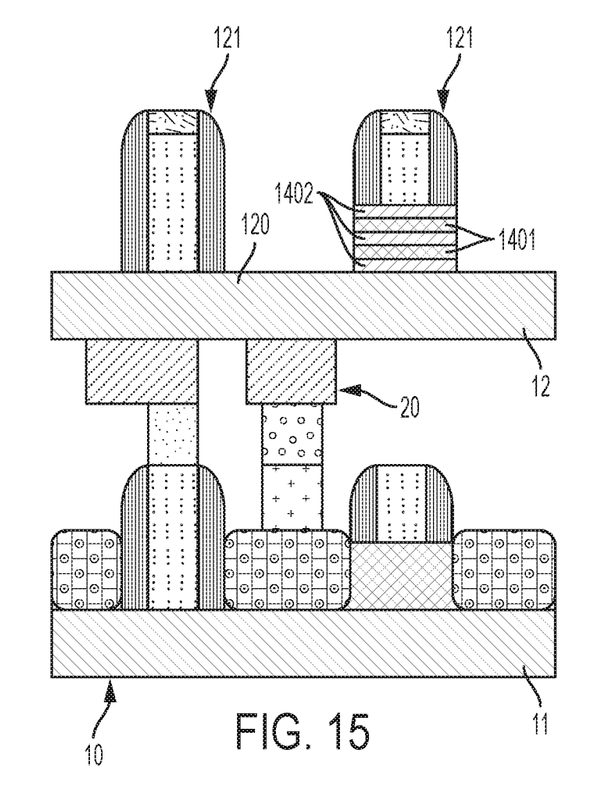
FIG. 15 is a side view of a three-dimensional (3D) monolithic semiconductor device with nanosheet (FETs) following nanosheet recessing operations in accordance with one or more embodiments.

With reference to FIG. 15, source and drain regions of the Si and SiGe layers 1401 and 1402 are recessed to exposed corresponding portions of the upper layer substrate 120. The only remainders of the Si and SiGe layers 1401 and 1402 following this recessing process are those portions lying below the nanosheet FINFET.

Figure 16:
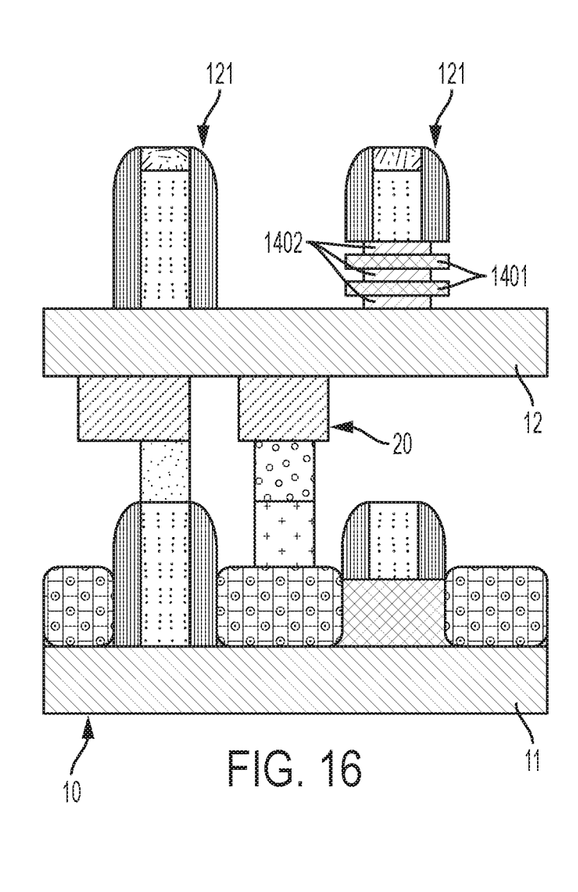
FIG. 16 is a side view of a three-dimensional (3D) monolithic semiconductor device with nanosheet (FETs) following continued nanosheet recessing operations in accordance with one or more embodiments.

In accordance with one or more embodiments and, with reference to FIG. 16, the recessing of the source and drain regions of the Si and SiGe layers 1401 and 1402 can continue until the only remainders of the Si and SiGe layers 1401 and 1402 following this recessing process are those portions lying below the nanosheet FINFET. Here, the resulting structure is characterized in that the SiGe layers 1402 are indented relative to the Si layers 1401 underneath the nanosheet FINFET.

Figure 17:
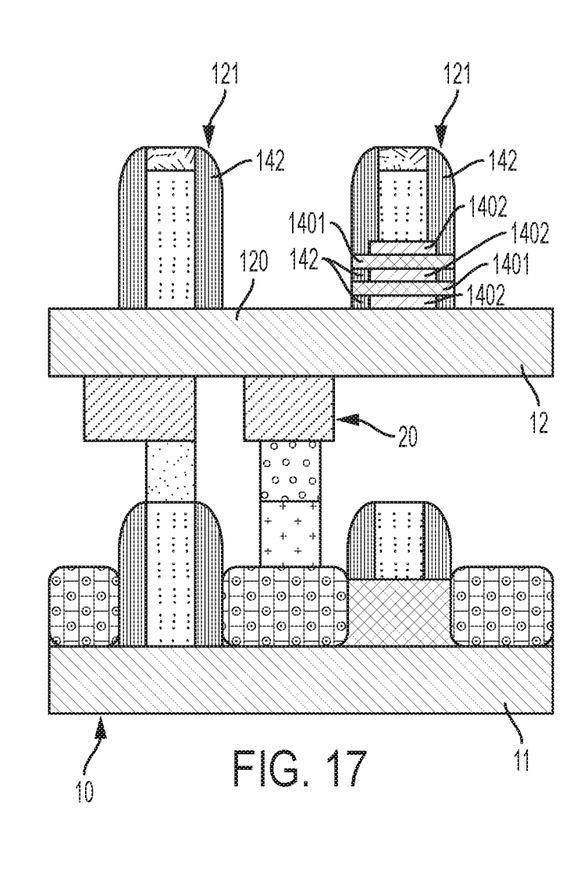
FIG. 17 is a side view of a three-dimensional (3D) monolithic semiconductor device with nanosheet (FETs) following spacer re-construction in accordance with one or more embodiments.

With continued reference to FIG. 16 and with additional reference to FIG. 17, once the recessing of the source and drain regions of the Si and SiGe layers 1401 and 1402 is complete with the SiGe layers 1402 indented relative to the Si layers 1401, material of the upper layer spacers 142 can be re-deposited into the interstitial regions above and below distal portions of the Si layers 1401. This spacer material can then be etched back by selective RIE to reform the nanosheet FINFET with interleaved spacer and Si layer portions on its lateral sides. The following description will relate to this structure. This is done for clarity and brevity and it is to be understood that the description provided below is applicable to the structure of FIG. 15 as well.

Figure 18:
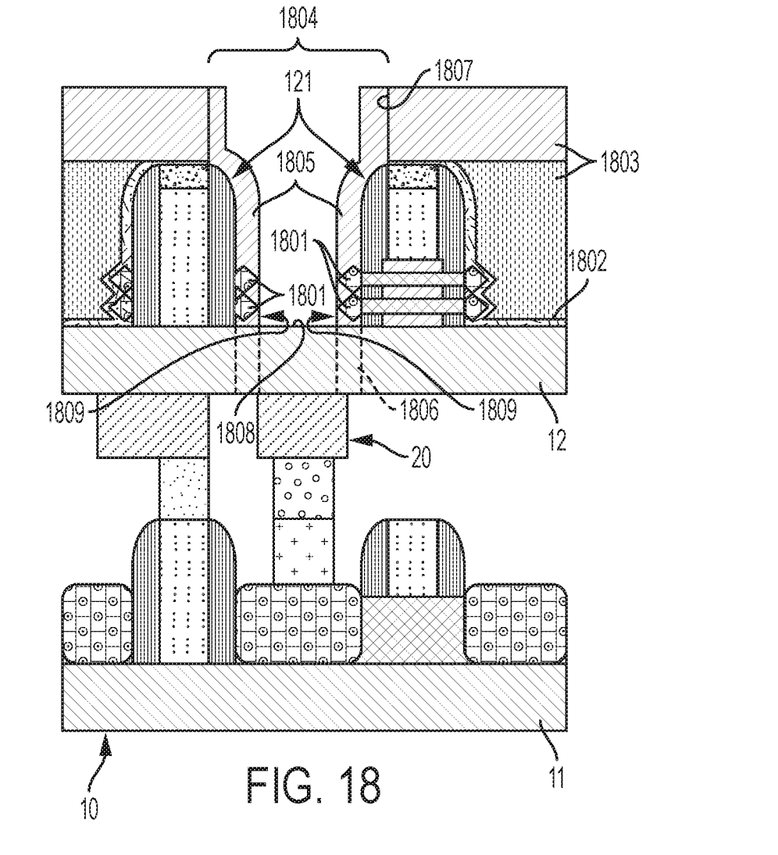
FIG. 18 is a side view of a three-dimensional (3D) monolithic semiconductor device with nanosheet (FETs) following liner and oxide deposition, contact hole formation and second spacer deposition in accordance with one or more embodiments.

With reference to FIG. 18, following merged or un-merged epitaxial growth of contacts 1801 on the planar FET and the nanosheet FINFET and additional processing that is similar to the processing described above, a liner 1802 and first oxides 1803 are deposited over the upper layer electronic devices 121. A contact hole 1804 is then defined between the upper layer electronic devices 121 and a second oxide 1805 is deposited over a periphery 1806 of the upper surface of the upper layer substrate 120. The second oxide 1805 can thus extend from the upper layer substrate 120 along interior facing sidewalls 1807 of the contact hole 1804. The second oxide 1805 can be provided as a tubular feature that covers the periphery 1806 and the interior facing sidewalls 1807 of the contact hole 1804 but leaves a central portion 1808 of the upper layer substrate 120 exposed. Because the interior facing sidewalls 1807 at lower heights are formed to include the epitaxially grown contacts 1801, the second oxide 1805 therefore serves effectively as a second spacer 1809 for the planar FET and the nanosheet FINFET.

Figure 19:
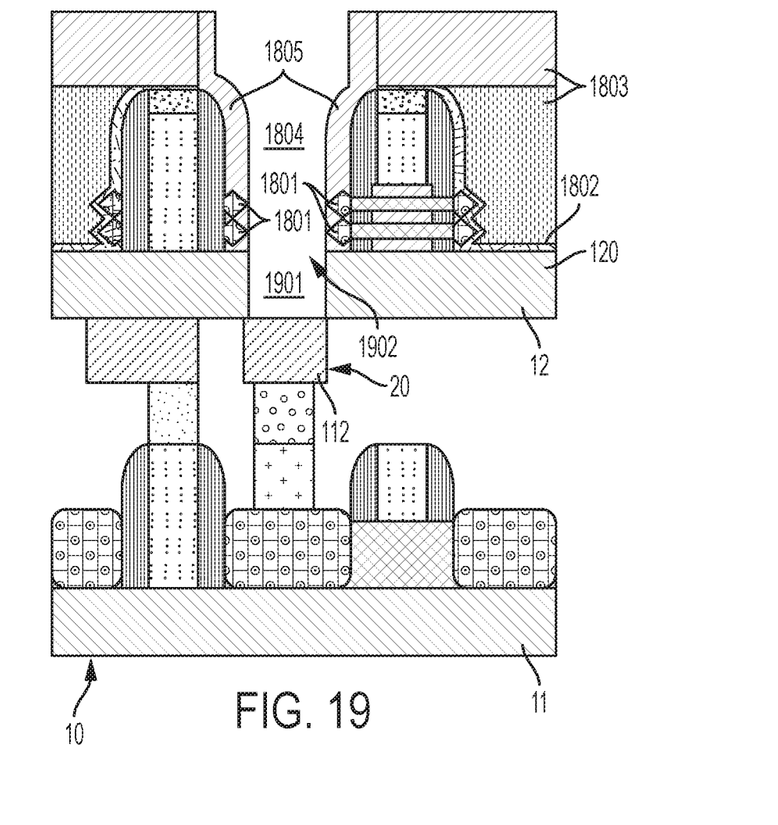
FIG. 19 is a side view of a three-dimensional (3D) monolithic semiconductor device with nanosheet (FETs) following through-hole formation in accordance with one or more embodiments.

With reference to FIG. 19, once the second oxide 1805 is deposited, an etching process is conducted to form an additional contact hole 1901 through the central portion 1808 of the upper layer substrate 120. The additional contact hole 1901 extends from a lowermost extent of the contact hole 1804 to an upper surface of the metallization layer element 112 of the stack 20 to define a through-hole 1902.

Figure 20:
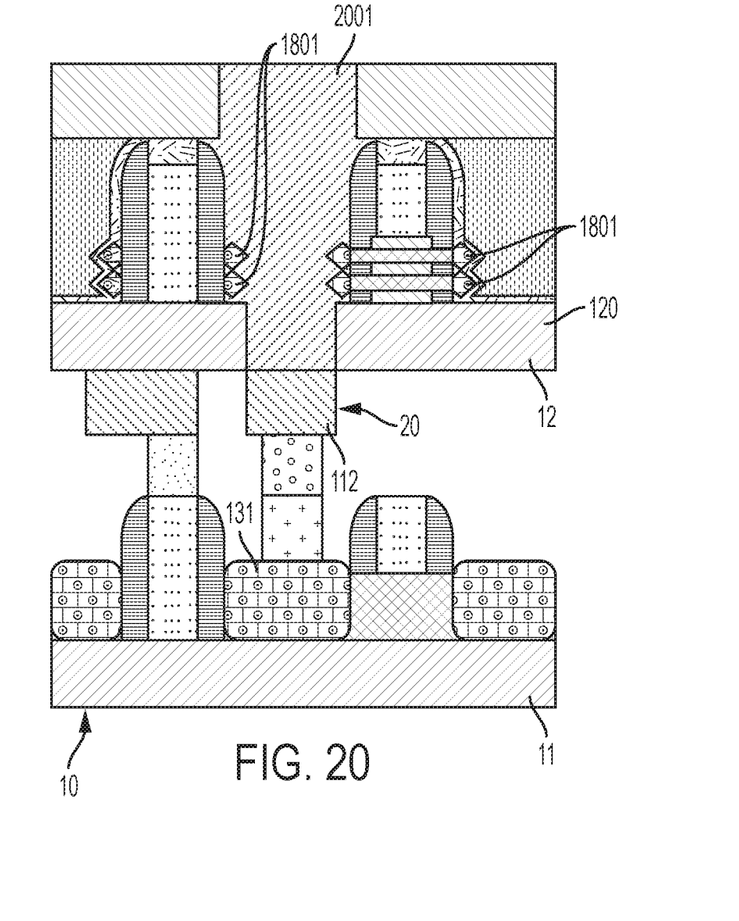
FIG. 20 is a side view of an interlayer via disposed within the through-hole of FIG. 19 in accordance with one or more embodiments.

With reference to FIG. 20, once the through-hole 1902 is defined as a combination of the contact hole 1804 and the additional contact hole 1901, the second oxide 1805 (i.e., the second spacer 1809) can be removed.

With reference to FIG. 20, an interlayer via 2001 is formed. The interlayer via 2001 is formed by tungsten being filled into the contact hole 1804 and the additional contact hole 1901 (see FIG. 19) and then being formed into a silicide, such as tungsten silicide. The interlayer via 2001 thus electrically contacts the upper surface of the metallization layer element 112 of the stack 120 and the epitaxially grown contacts 1801. Therefore, the interlayer via 2001 extends through the through-hole 1902 to electrically couple the epitaxially grown contacts 1801 to the one of the lower layer drain or source contacts 131 that complements the epitaxially grown contacts 1801 via the stack 20. The interlayer via 2001 includes a central portion, which extends through what was the central portion 1808 of the upper layer substrate 120 (see FIG. 18), and a peripheral flange that occupies the space that was formerly occupied by the second oxide 1805 (see FIG. 18).

Descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. An integrated circuit comprising:
   a lower layer comprising a lower substrate, lower electronic devices, metallization elements and contact elements;
   wherein one of the lower electronic devices comprises:
      a field effect transistor (FET) comprising a gate,
      lower contacts comprising complementary source or drain epitaxial contacts, and
      spacers interposed between the gate of the FET and the lower contacts;
   wherein at least one of the contact elements is communicatively coupled between a metallization element and one of the lower contacts to form a stack;
   an upper layer comprising an upper substrate and upper electronic devices;
   wherein one of the upper electronic devices comprises:
      an FET comprising a gate,
      upper contacts comprising complementary source or drain epitaxial contacts, and
      spacers interposed between the gate of the FET and the upper contacts, and
   wherein the upper substrate defines a first contact hole, one of the upper contacts defines a second contact hole aligned with the first contact hole and the first and second contact holes cooperatively define a through-hole aligned with the stack; and
   an interlayer via extending through the through-hole to communicatively couple the stack and the one of the upper contacts.

2. The circuit according to claim 1, wherein:
   the lower substrate comprises a semiconductor substrate; and
   the upper substrate comprises a bonding film.

3. The circuit according to claim 1, wherein:
   the FET of the lower layer comprises at least one of a planar FET, a finFET and a nanosheet FET; and
   the FET of the upper layer comprises at least one of a planar FET, finFET and a nanosheet FET.

4. The circuit according to claim 1, wherein the one of the upper contacts comprises at least one of merged epitaxial contacts, un-merged epitaxial contacts, a planar epitaxial contact, non-epitaxial fins and a non-epitaxial planar device.

5. The circuit according to claim 1, wherein the interlayer via comprises an electrically conductive material.

6. The circuit according to claim 1, wherein the upper and lower layers are adjacent.

7. The circuit according to claim 1 further comprising intermediate layers interposed between the upper and lower layers.

8. An integrated circuit comprising:
   a lower layer comprising a lower substrate, lower electronic devices, metallization elements and contact elements;
   wherein one of the lower electronic devices comprises:
      a field effect transistor (FET) comprising a gate,
      lower contacts comprising complementary source or drain epitaxial contacts, and
      spacers interposed between the gate of the FET and the lower contacts;
   wherein at least one of the contact elements is communicatively coupled between a metallization element and one of the lower contacts to form a stack;
   an upper layer comprising an upper substrate and upper electronic devices;
   wherein one of the upper electronic devices comprises:
      a nanosheet FET comprising a gate,
      epitaxial contacts grown on sides of the nanosheet FET, and
      spacers interposed between the gate of the nanosheet FET and the epitaxial contacts;
   wherein the upper substrate defines a through-hole aligned with the stack and the epitaxial contacts such that the epitaxial contacts extend into the through-hole; and an interlayer via extending through the through-hole to communicatively couple the stack and the epitaxial contacts extending into the through-hole.

9. The circuit according to claim 8, wherein the epitaxial contacts are merged.

10. The circuit according to claim 8, wherein the epitaxial contacts are unmerged.

* * * * *